United States Patent [19]
Levien

[11] Patent Number: 5,388,517
[45] Date of Patent: Feb. 14, 1995

[54] METHOD AND APPARATUS FOR AUTOMATIC ALIGNMENT OF OBJECTS AND REGISTER MARK FOR USE THEREWITH

[76] Inventor: Raphael L. Levien, P.O. Box 31; Rte. 1, Box 18 (UPS), McDowell, Va. 24458

[21] Appl. No.: 123,871

[22] Filed: Sep. 20, 1993

Related U.S. Application Data

[63] Continuation of Ser. No. 764,647, Sep. 24, 1991, abandoned.

[51] Int. Cl.[6] .......................................... B41F 13/12
[52] U.S. Cl. .................................... 101/485; 101/211
[58] Field of Search ............... 101/181, 248, 485, 486, 101/211, 170, 171, 481; 250/491.1, 398, 492.2; 358/454; 356/363, 401, 374; 226/2, 3, 27, 28, 24

[56] References Cited

U.S. PATENT DOCUMENTS

| | | | |
|---|---|---|---|
| 3,015,266 | 1/1962 | Anderson | 101/211 |
| 4,273,045 | 6/1981 | Crowley . | |
| 4,431,923 | 2/1984 | Wang et al. | 250/491.1 |
| 4,468,706 | 8/1984 | Cahill | 358/300 |
| 4,704,033 | 11/1987 | Fay et al. . | |

FOREIGN PATENT DOCUMENTS

| | | |
|---|---|---|
| 8604158 | 7/1986 | European Pat. Off. . |
| 59-083167 | 5/1984 | Japan . |
| 63-311735 | 12/1988 | Japan . |
| 2183364A | 6/1987 | United Kingdom . |

OTHER PUBLICATIONS

IBM Technical Disclosure Bulletin—vol. 32 No. 10B Mar. 1990.
GATF Product Catalog 1991 Edition.

*Primary Examiner*—J. Reed Fisher
*Attorney, Agent, or Firm*—Allan Jacobson

[57] ABSTRACT

A register mark and a system for bringing a pair of register marks into alignment is disclosed. A first register mark comprises a plurality of dots of a first frequency, and a second register mark comprises a plurality of dots of a second, generally higher frequency. When the first and second register marks are overlaid, an interference pattern resulting from the difference in frequency is observed. The first and second register marks are in alignment when the interference pattern produces a maximum bright spot in the center of the register mark. A small relative movement of the first and second register marks results in a larger relative movement of center of the bright spot. The position of the bright spot indicates which direction and how much to move the second register mark in order to achieve image registration. In an alternate embodiment of the present invention, the frequency of dots in each register mark is warped with distance from the center of the mark. The frequency of the dots of the second register mark is also warped with distance from the center, but overall has a generally higher frequency of dots as compared to the first register mark. The interference pattern resulting from an overlay of the latter two register marks results in a bright spot which occurs unambiguously when the two register marks are in alignment. At misalignments of more than one dot width, the bright spot breaks up so that the overlaid register marks may serve as quick visual check of proper alignment.

48 Claims, 6 Drawing Sheets

OUT OF REGISTER
3 PIXELS RIGHT, 2 PIXELS DOWN

BOTTOM

TOP

IN REGISTER

OUT OF REGISTER
3 PIXELS RIGHT, 2 PIXELS DOWN

OUT OF REGISTER
13 PIXELS RIGHT, 5 PIXELS DOWN

IN REGISTER

+2 PIXELS

+12 PIXELS

+4 PIXELS

+14 PIXELS

+6 PIXELS

+16 PIXELS

+8 PIXELS

+18 PIXELS

+10 PIXELS

+20 PIXELS

METHOD AND APPARATUS FOR AUTOMATIC ALIGNMENT OF OBJECTS AND REGISTER MARK FOR USE THEREWITH

This is a continuation of application Ser. No. 764,647, filed Sep. 24, 1991, now abandoned.

FIELD OF THE INVENTION

The present invention relates to the field of register marks used for adjusting the relative position of two or more objects in order to bring the objects into alignment.

BACKGROUND OF THE INVENTION

In many manufacturing processes, it is often necessary to align two objects, such as two layers in which one layer will overlie the other. For example, in semiconductor manufacturing, successive masks which define the semiconductor structure are placed over the semiconductor substrate at various stages in the manufacturing process. Each successive mask must precisely align with the position of a previous mask on the semiconductor substrate.

As another example, in color printing, an original color image is scanned to separate the original image into several component colors, each of which component color will be separately printed in alignment with the layers above and below. Therefore, the color printing plates must be manufactured so that each of the separate color images are printed in precise alignment or registration with each other.

Specifically, an original input image is processed to produce four screened images: one for each of the printing inks of cyan, magenta, yellow and black. The four screened images are then used to burn printing plates needed in a four color printing reproduction process. In burning the plate, the image negative is affixed to a transparent acetate sheet with holes punched. The acetate sheet is then placed on the plate burning machine, which has metal tabs that fit into the holes in the acetate sheet. Each of the acetate sheets must have negatives at exactly the same position relative to the holes in order to insure that the plates have images in the same place. Accurate placement of the negatives on the acetate sheets is even more important if each plate is to be burned with more than one negative each.

To accurately place the negative on the acetate sheet, register marks are used. The first negative, typically corresponding to the black image plane, is placed on a light table that has metal tabs to fit the holes in the acetate sheet. The location of the first negative on the first acetate sheet is not too critical; a typical tolerance is on the order of 50 mils. The first negative placement determines the general location of the color image on the printed page.

The next step is to put another acetate sheet over the first sheet, and place a second negative, say the negative corresponding to the magenta image plane on the second acetate sheet in precise relation to the first negative on the first acetate sheet. To facilitate alignment, image negatives have register marks which are not part of the image and are later removed. The operator examines the register marks, usually with the aid of a magnifier. By close examination of the register marks, the operator determines the position of the second negative on the second acetate sheet for which the two register marks are exactly overlaid. The second acetate sheet carrying the aligned second image negative (magenta) is then removed. The process is repeated for a third acetate sheet and a third negative, say for cyan, and again for yellow. The acetate sheets are then used as indicated above to burn printing plates. The quality of color printing is dependent upon the accuracy of alignment of the four color images in the overall plate burning and printing process.

Automated processes for the automatic alignment of register marks are also known. The composite image of the two register marks is captured in a memory, the alignment error is measured, and one plate is moved in a direction so as to reduce the measured error. When the measured error is minimized, the register marks are aligned.

There are many known prior art register marks used to align two overlying transparent layers. One type of conventional register mark consists of crosshairs, i.e. a plus sign. This form of register mark has two disadvantages. First, a crosshairs register mark requires close examination, usually with the aid of a magnifier, to determine exact alignment. Second, when the two planes are not in good register, it is very difficult to determine from the nonaligned crosshair composite image which direction to move the top plane. Generally, trial and error movements indicate to the observer which direction to move the top plane. The need for close inspection and trial movements makes automated adjustment complex and expensive, in both the optical system and in the mechanical control system.

SUMMARY OF THE INVENTION

The present invention is embodied in a register mark and system for bringing a pair of register marks into alignment. A first register mark comprises a plurality of dots of a first frequency, and a second register mark comprises a plurality of dots of a second, generally higher frequency. When the first and second register marks are overlaid, an interference pattern resulting from the difference in frequency is observed. The first and second register marks are in alignment when the interference pattern produces a maximum bright spot in the center of the register mark. A small relative movement of the first and second register marks results in a larger relative movement of center of the bright spot.

In an alternate embodiment of the present invention, the frequency of dots in each register mark is warped with distance from the center of the mark. Specifically, the frequency of the dots in the first register mark is higher at the center than at the edges. The second register mark also contains a similar warping in frequency of the dots with distance from the center, but overall has a generally higher frequency of dots. The interference pattern resulting from an overlay of the two register marks results in a bright spot which occurs unambiguously when the two register marks are in alignment. At misalignments of more than one dot width, the bright spot breaks up so that the overlaid register marks may serve as quick visual check of proper alignment.

Register marks in accordance with the present invention may also be printed alongside the color image to check the final alignment of the overall printing process, or to monitor the operation of a high speed printing press. Furthermore, register marks in accordance with the present invention may be used in projection alignment systems where one register mark is printed or otherwise fixed onto a surface, and the other register mark is projected onto the first register mark, as for example in the manufacture of semiconductor integrated circuits. In general, as used herein, the term "print" shall mean either the deposition or removal of material so as to form an image on the surface of an object.

DETAILED DESCRIPTION

Figure 1:
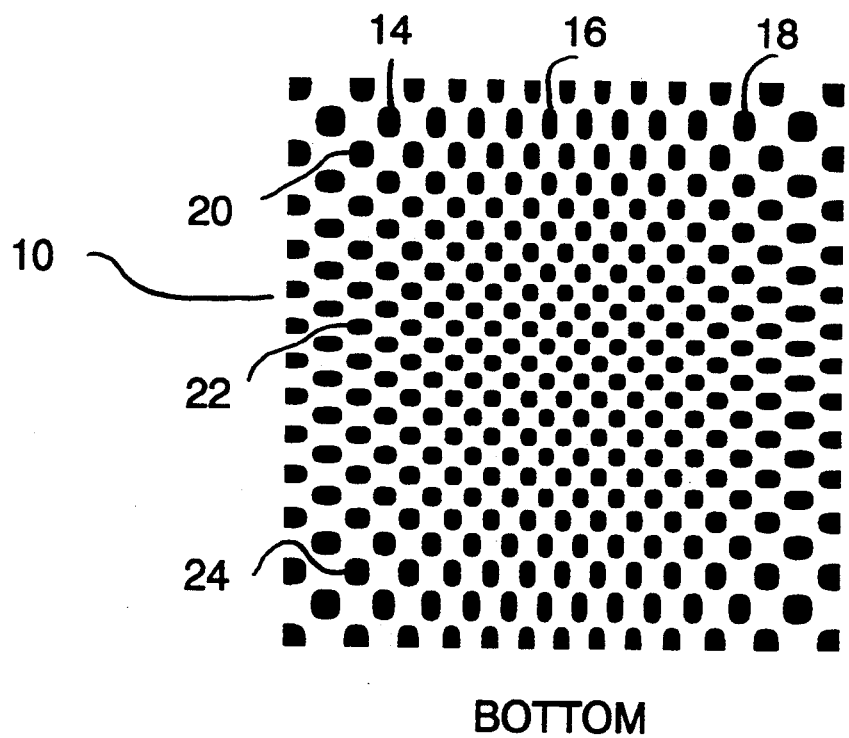
FIG. 1 is an illustration of a bottom register mark in accordance with the present invention.

A register mark in accordance with the present invention is shown in FIG. 1, as a first register mark 10 comprising a plurality of dots of a first frequency. At least one horizontal line of dots includes dots 14, 16 and 18. The frequency at the center of the horizontal line is greatest at dot 16 near the center of the horizontal line, while the frequency of dots 14 and 18 decreases generally at distances away from the center. Similarly, register mark 10 includes at least one vertical line of dots such as dots 20, 22 and 24. The frequency at the center of the vertical line is greatest at dot 22 near the center of the horizontal line, while the frequency of dots 20 and 24 decreases generally at distances away from the center.

Figure 2:
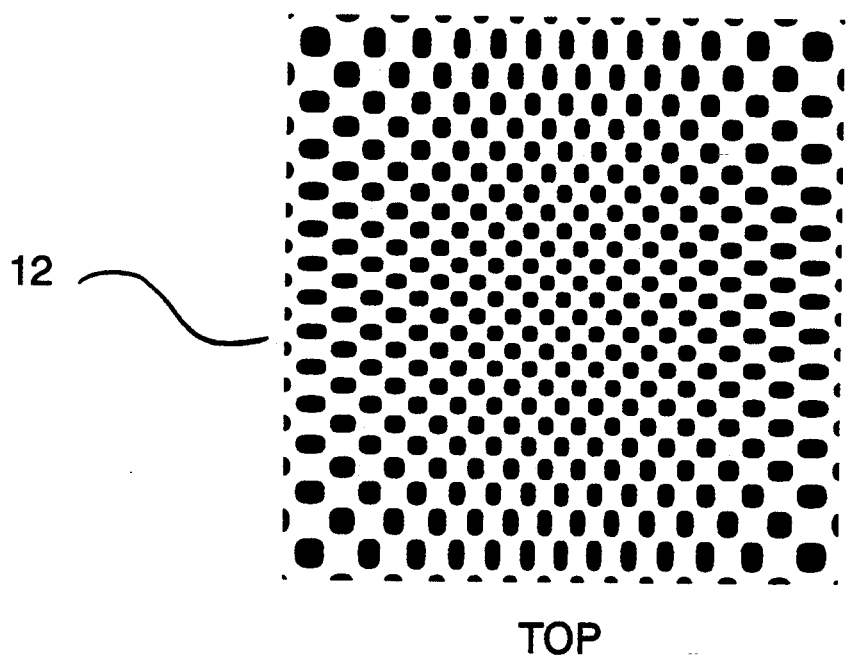
FIG. 2 is an illustration of a top register mark in accordance with the present invention.

FIG. 2 is a second register mark 12 comprising a plurality of dots. The arrangement of the second register mark is similar to the first register mark, but the entire pattern is of a generally higher frequency. For example, register mark 12 may have 5% higher frequency at all points, which results in a slightly smaller size for the second register mark as compared to the first register mark.

Figure 3:
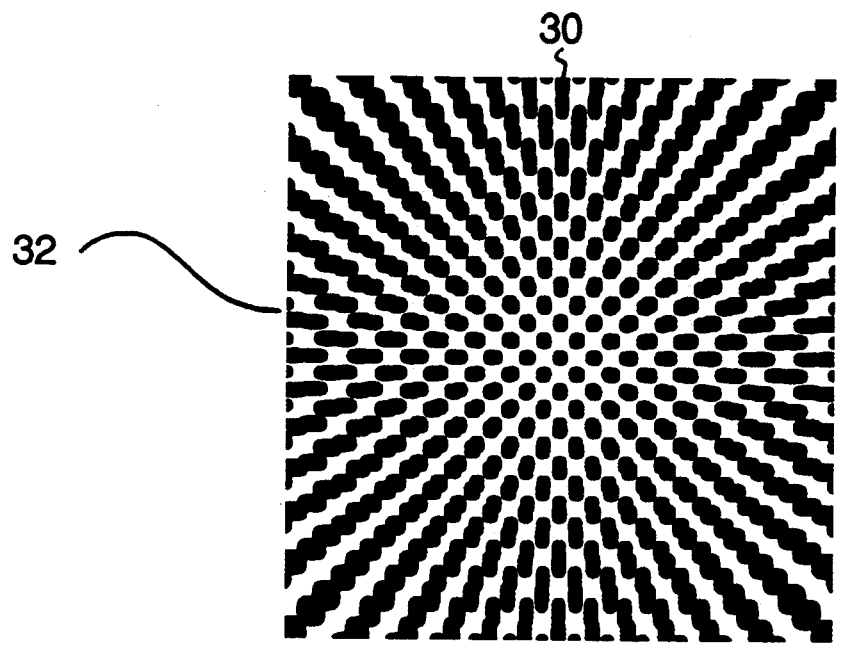
FIG. 3 is an illustration of a top and bottom register mark in accordance with the present invention shown with top and bottom register marks in alignment.

FIG. 3 shows the first and second register marks in register. When the first and second register marks are in alignment, an interference pattern, produced by the sum and difference of the frequencies of the first and second register marks produces a bright spot in the center of the register mark. The bright spot results because the dots of the register mark tend to be coincident near the center, minimizing black while maximizing white area. Due to the frequency difference, the dots at a distance from the center tend to be more and more non-coincident, resulting in more and more black area. The net effect is a bright spot with a peak at coordinates defined by column 30 and row 32.

Figure 4:
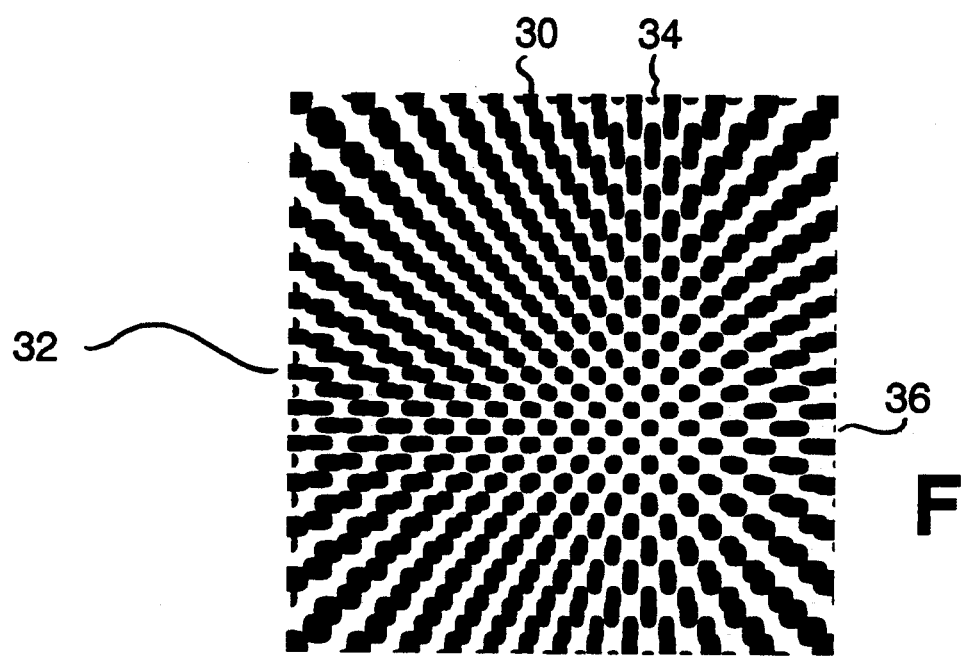
FIG. 4 is an illustration of a top and bottom register mark in accordance with the present invention shown with top and bottom register marks out of alignment by 3 pixels to the right and 2 pixels down.

As the first and second register marks are moved out of alignment, the center of the bright spot moves away from the center in a direction so as to indicate the direction of the misalignment. Furthermore, if one mark is moved a small amount, the bright spot moves a much larger amount. The ratio is inversely proportional to the difference between the top and bottom register mark frequencies. By using a very small frequency difference between the two register marks, a magnification of 10 is easy to achieve. An example of an out of register condition is illustrated in FIG. 4 in which the top register mark is moved 3 pixels to the right and 2 pixels down. The center of the bright spot has moved to a coordinate location defined by column 34 and row 36, a much greater movement than 3 pixels right and 2 pixels down would indicate.

Figure 5:
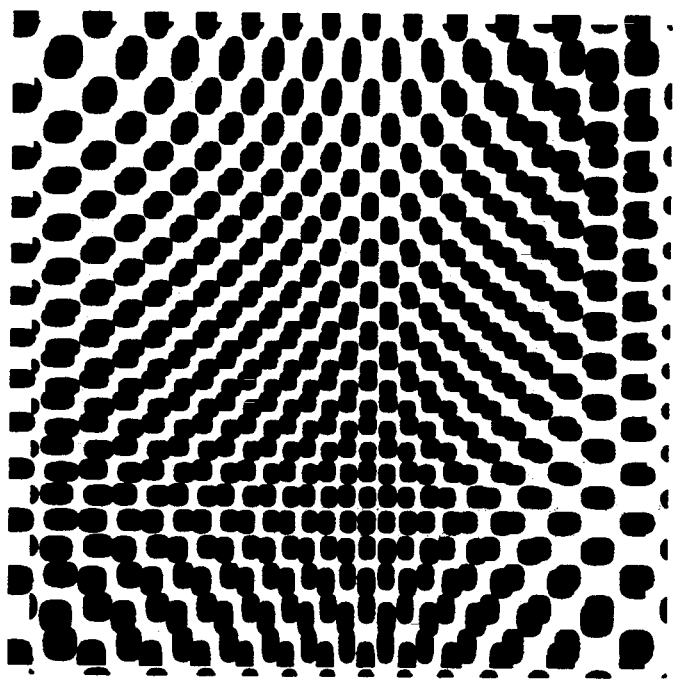
FIG. 5 is an illustration of a top and bottom register mark in accordance with the present invention shown with top and bottom register marks out of alignment by 13 pixels to the right and 5 pixels down.

As the first and second register marks are moved even further out of alignment, the pattern becomes incoherent, i.e. there is no clearly defined bright spot. The latter situation is illustrated in FIG. 5 in which the top register mark is moved 13 pixels to the right and 5 pixels down. The patterns resulting from the use of register marks in accordance with the present invention are also known as moire patterns, which result from small differences in screen rulings and screen angles in the printing of color images.

Although dots shown in register marks 10 and 12 are of a generally rectangular shape, other dot shapes will also work. Furthermore, instead of frequency warping, one register mark may have a periodic pattern of a constant single frequency, and the second register mark may have a periodic pattern of a constant single, slightly higher frequency. A constant frequency pattern will produce an appropriate interference pattern and bright spot to indicate alignment. However, in the case of a constant frequency pattern, as the bright spot moves quickly to one side, another bright spot will move in from the other side. When the top and bottom register marks are offset by exactly one dot cycle, the bright spot appears exactly the same as when the top and bottom register marks are in perfect register. Due to the above described ambiguity, a constant frequency pattern cannot be used as a quick visual check of proper alignment, i.e. as a go/no go indicator. The warping of the dot pattern frequency with distance from the center of the register mark, avoids the ambiguity which could result from constant frequency register marks offset by one dot cycle.

Figure 6A:
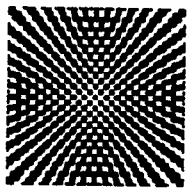
FIGS. 6A–6K illustrates successive top and bottom register marks in accordance with the present invention, each successive figure shown with top and bottom register marks out of alignment by an additional 2 pixels to the right.
Figure 6B:
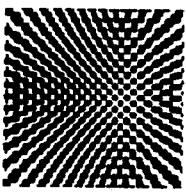
Figure 6G:
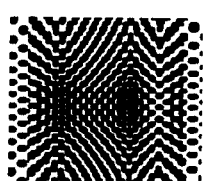
Figure 6C:
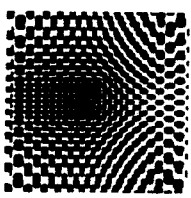
Figure 6H:
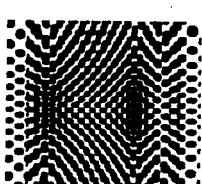
Figure 6D:
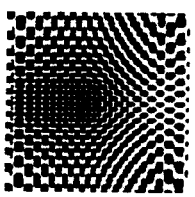
Figure 6I:
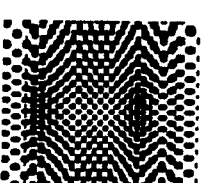
Figure 6E:
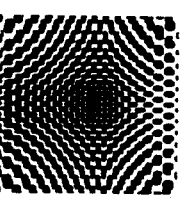
Figure 6J:
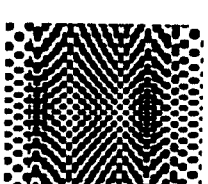
Figure 6F:
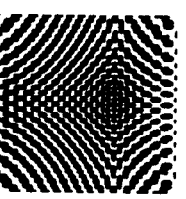
Figure 6K:
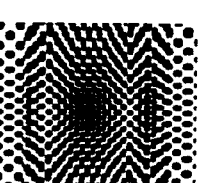

An illustration of the interference patterns resulting from different relative horizontal positions of the top and bottom register marks is shown in FIGS. 6A through 6K. In each successive figure, the top register mark is moved to the right, out of alignment by an additional 2 pixels as compared to the prior figure. The bright spot indicating alignment in FIG. 6A, moves further to the right in FIGS. 6B, 6C, 6D and 6E, until substantially disappearing as shown in FIG. 6F. FIG. 6F also shows another bright spot moving in from the other side. However, as shown in FIGS. 6G, 6H, 6I, 6J and 6K the new bright spot breaks up before it moves to the center of the register mark. It is noted that two pairs of one dimensional register marks may also be used in lieu of the single pair of two dimensional register marks shown. In the latter case, one pair of register marks may provide a first bright spot in the form of a bright bar (instead of a circle) to indicate horizontal registration, while the other pair of register marks provides a second bright spot in the form of a bright bar to indicate vertical registration.

Figure 7:
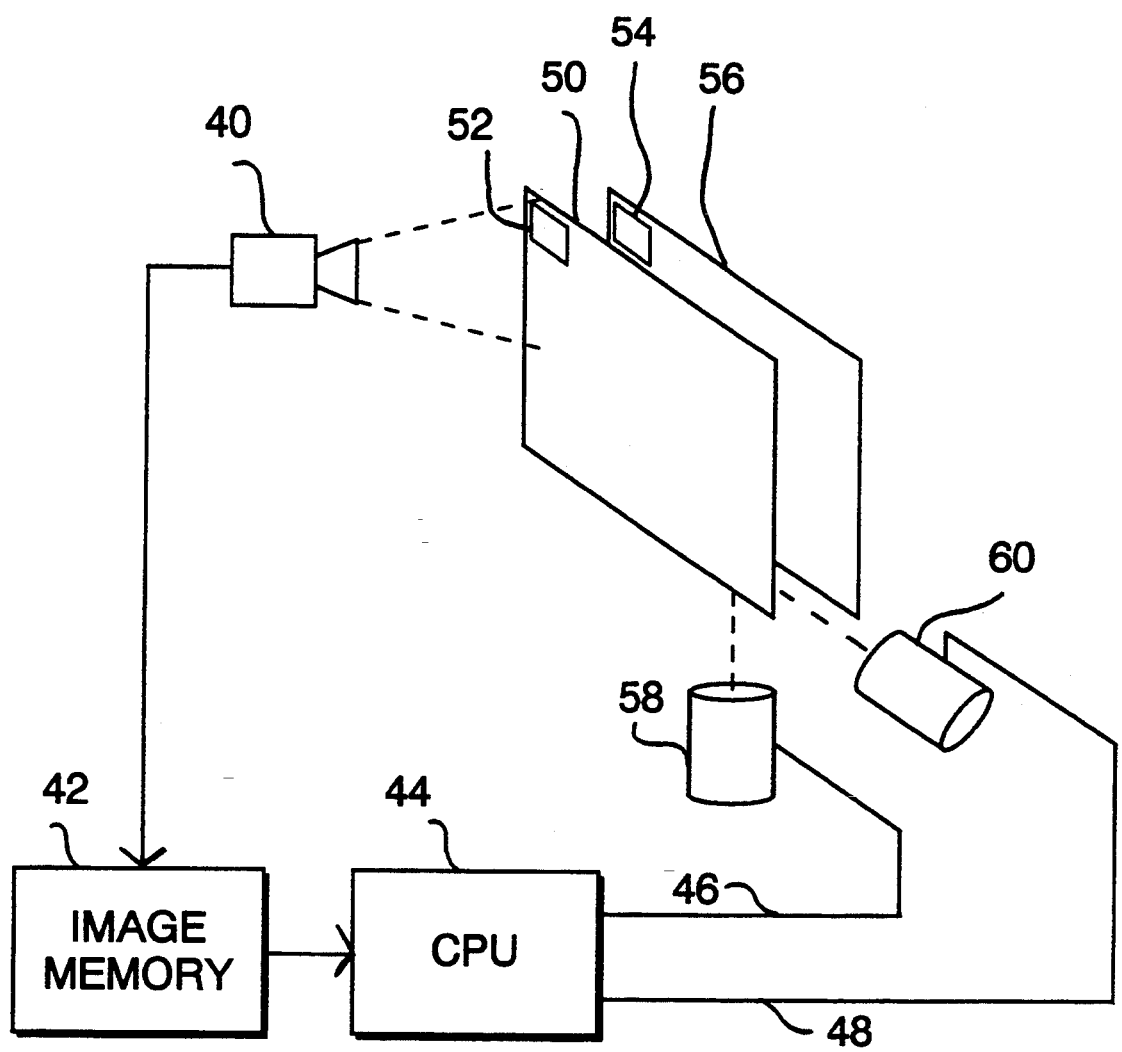
FIG. 7 is a block diagram of an automatic alignment system used in conjunction with a register mark in accordance with the present invention.

A particular advantage of the register mark of the present invention is that the position of the bright spot indicates which direction and how much to move the register mark in order to achieve image registration, a feature particularly useful in automatic alignment systems. FIG. 7 is a block diagram of a system for automatically aligning two layers 50 and 56 using register marks 52 and 54 of the present invention. The system comprises an image capture apparatus 40, which may be a video camera or a line of photosensors, an image memory 42, a central processing unit (CPU) 44, and actuators 58 and 60 for moving layer 50 relative to layer 56.

In operation, layers 50 and 56 are placed in approximate alignment with register mark 52 overlying register mark 54. Camera 40 captures an image of the two register marks for storage in an image memory 42. CPU 44, responsive to the image memory 42 provides a vertical actuation signal on conductor 46 to vertical actuator 58, and a horizontal actuation signal on conductor 48 to horizontal actuator 60, until register marks 52 and 54 are in substantial alignment.

Figure 8:
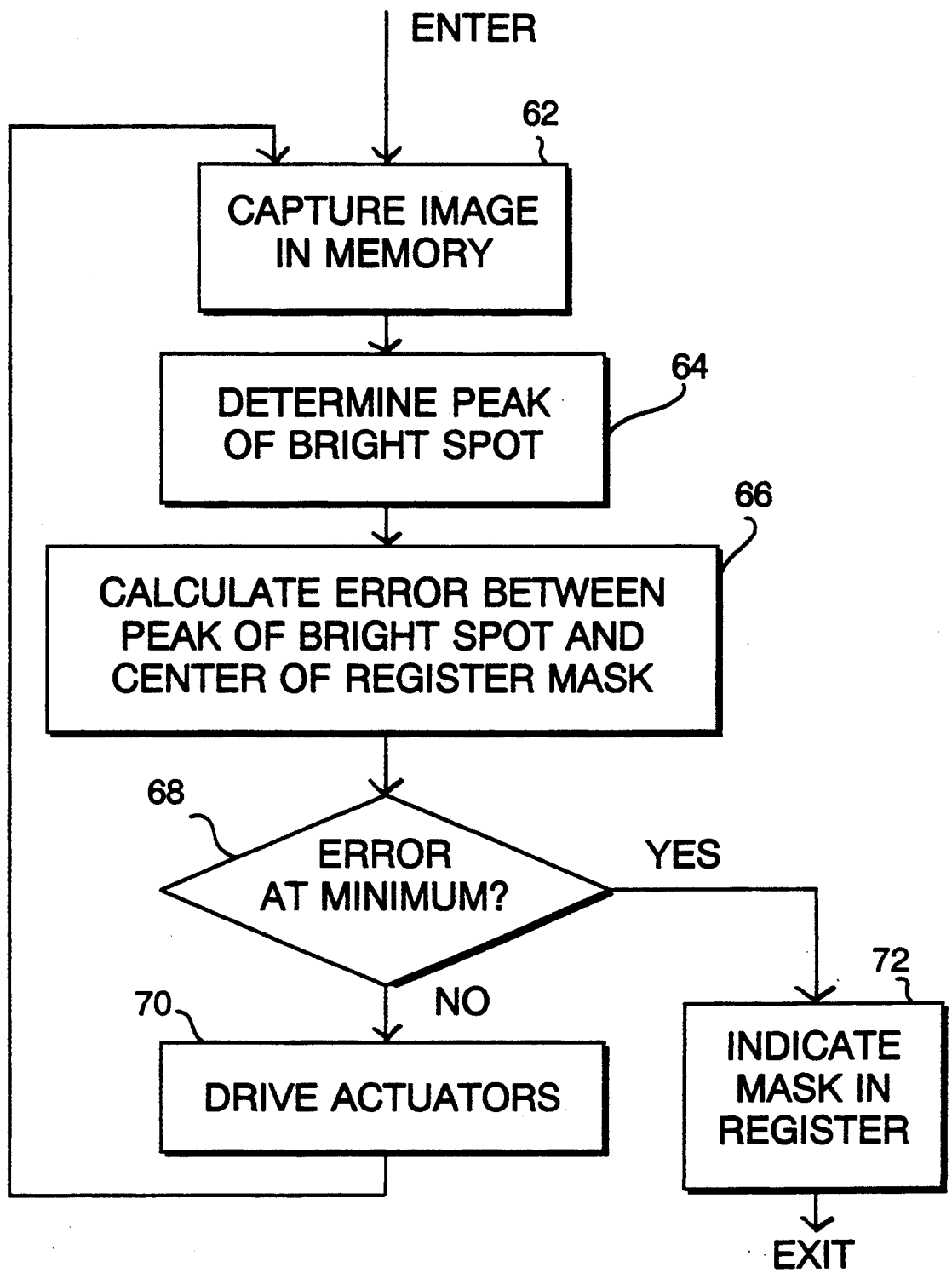
FIG. 8 is a flow chart in accordance with the present invention for the computer program in the CPU of FIG. 7.

A flow chart for the program of CPU 44 is shown in FIG. 8. First an image of the two overlying register marks is captured at step 62. Thereafter, the peak of the bright spot is determined at step 64. Many techniques, such as upsampling and interpolation, are known to those skilled in the art for determining the position of a peak from a set of data points. After the peak is determined, the error between the peak of the bright spot and the center of the register mark is calculated at step 66. If the error is at a minimum, an indication of registration is made at step 72. However, if the test at 68 indicates an error, the drive actuators are effected at step 70 to bring the two register marks 52, 54 into alignment. A new image is captured at step 62, and the process repeats.

Register marks are also often printed alongside the completed color image in order to check the overall printing system accuracy. One pair of register marks may be used for each of cyan, magenta and yellow, the register mark for each color being printed over the register mark for black. A glance at the pairs of printed register marks will tell whether each of the color planes of the final image has been accurately aligned.

In the case of a moving printed image, as in a high speed printing press, the printed register marks may be used to monitor the accuracy of the overall printing system. The image of the register marks may be captured by the use of a line sensor of photosensitive elements to scan the image of the register marks as the printed register marks move past the line sensor. The image processor detects misalignments by the position of the bright spot and initiates appropriate adjustments or alerts the operator to the status of the error condition. A register mark of the present invention does not require high intensity flash illumination systems or high resolution optics, in order to accurately determine alignment error from the register marks, thereby saving considerable cost and complexity in the design of automatic alignment and monitoring systems.

Finally, register marks in accordance with the present invention may be used in projection alignment systems to align integrated circuit masks used in semiconductor manufacturing. In the latter case, the first register mark may be etched or deposited on the substrate, and the other register mark projected onto the first register mark. The finished semiconductor wafer may contain one or more pairs of overlying register marks so that an observer may determine at a glance whether each of the semiconductor masks of the final integrated circuit have been accurately aligned.

A program written in QuickBASIC 4.5 to generate a register mark is given below:

```
SUB MakeReg (z)
    DIM zz(200)
    FOR i = 0 TO 199
        za = i - 100
        zb = za * .01
        zc = zb - .2 * zb ^ 3
        zd = COS(zc * 50 * z)
        zz(i) = zd
    NEXT
    FOR j = 0 TO 199
        zj = zz(j)
        FOR i = 0 TO 199
            IF zz(i) * zj > -.25 THEN PSET (i, j)
        NEXT
    NEXT
END SUB
```

The z parameter is preferably 1.0 for the first (black plane) register mark 10, and 1.05 for the other register mark 12, corresponding to a 5 percent increase in frequency between the first and second register marks. The above program generates a register mark 200×200 pixels. The −0.25 figure controls the size of the dots in the register mark pattern (i.e. the percent gray, not the frequency), and may be changed for different dot sizes, as desired.

What is claimed is:

1. A method for aligning first and second objects, wherein said first and second objects are coupled to respective first and second register marks, said first register mark including a first plurality of dots at a first frequency and said second register mark including a second plurality of dots at a second frequency, said method comprising:

providing said first register mark including a first plurality of dots at a first frequency arranged in a two dimensional array wherein the frequency of dots in said first register mark is maximum at the center and decreases with radial distance in substantially all directions from the center of said first register mark; and providing said second register mark including a second plurality of dots at a second frequency arranged in two dimensional array wherein the frequency of dots in said second register mark is maximum at the center and decreases with radial distance in substantially all directions from the center of said second register mark, said frequency of dots in said second register mark being greater than said frequency of said dots in said first register mark at corresponding points of said first and second register marks respectively;

positioning at least one of said first and second objects so that said second register mark is disposed in overlaid relation to said first register mark, thereby producing a bright spot providing a peak indication having a maximum point substantially common to said first and second overlaid register marks indicative of the registration of said first and second register marks;

detecting the position of said bright spot providing a peak indication as said maximum point derived from a set of data points; and moving said one of said first and second objects to reposition said bright spot providing a peak indication towards the center of said one of said first and second register marks.

2. A method in accordance with claim 1, wherein said first register mark is printed, and second register mark is printed over said first register mark.

3. A method in accordance with claim 1, wherein said first register mark is printed, and second register mark is projected over said first register mark.

4. A method in accordance with claim 1, wherein said first object represents a first color plane of a printed color image and said second object represents a second color plane of said printed color image.

5. A method in accordance with claim 1, wherein said first object is a first semiconductor mask of an integrated circuit, and said second object is a second semiconductor mask of said integrated circuit.

6. A method for aligning first and second objects, wherein said first and second objects are coupled to respective first and second register marks, said first register mark including a first plurality of dots and said second register mark including a second plurality of dots, wherein the frequency of dots in each register mark is minimum at the center and increases with distance in substantially opposite directions from the center of each said register mark, said method comprising:

providing said first register mark including a first plurality of dots at a first frequency arranged in a two dimensional array wherein the frequency of dots in said first register mark is minimum at the center and increases with radial distance in substantially all directions from the center of said first register mark; and providing said second register mark including a second plurality of dots at a second frequency arranged in two dimensional array wherein the frequency of dots in said second register mark is minimum at the center and increases with radial distance in substantially all directions from the center of said second register mark, said frequency of dots in said second register mark being greater than said frequency of said dots in said first register mark at corresponding points of said first and second register marks respectively;

positioning at least one of said first and second objects so that said second register mark is disposed in overlaid relation to said first register mark, thereby producing a bright spot providing a peak indication having a maximum point substantially common to said first and second overlaid register marks indicative of the registration of said first and second register marks;

detecting the position of said bright spot providing a peak indication as said maximum point derived from a set of data points; and moving said one of said first and second objects to reposition said bright spot providing a peak indication towards the center of said one of said first and second register marks.

7. A method for monitoring the alignment of first and second layers, wherein said first and second layers have a predetermined relation to respective first and second register marks, said first register mark including a first plurality of dots at a first frequency and said second register mark including a second plurality of dots at a second frequency, said method comprising:

providing said first register mark including a first plurality of dots at a first frequency arranged in a two dimensional array wherein the frequency of dots in said first register mark is maximum at the center and decreases with radial distance in substantially all directions from the center of said first register mark; and providing said second register mark including a second plurality of dots at a second frequency arranged in two dimensional array wherein the frequency of dots in said second register mark is maximum at the center and decreases with radial distance in substantially all directions from the center of said second register mark, said frequency of dots in said second register mark being greater than said frequency of said dots in said first register mark at corresponding points of said first and second register marks respectively;

positioning at least one of said first and second layers so that said second register mark is disposed in overlaid relation to said first register mark, thereby producing a bright spot providing a peak indication having a maximum point substantially common to said first and second overlaid register marks indicative of the registration of said first and second register marks;

detecting the position of said bright spot providing a peak indication as said maximum point derived from a set of data points; and providing an indication representative of the position of said bright spot providing a peak indication relative to the center of said one of said first and second register marks.

8. A method in accordance with claim 7, wherein said first register mark is printed, and second register mark is printed over said first register mark.

9. A method in accordance with claim 7, wherein said first layer represents a first color plane of a printed color image and said second layer represents a second color plane of said printed color image.

10. A method in accordance with claim 7, wherein said first layer is a first semiconductor mask of an integrated circuit, and said second layer is a second semiconductor mask of said integrated circuit.

11. A method in accordance with claim 7, wherein said step of detecting the position of said bright spot indicative of the registration of said first and second register marks includes sensing one line of said first and second register marks; and moving said first and second register marks thereby forming a two dimensional image of said first and second register marks.

12. A method for monitoring the alignment of first and second layers, wherein said first and second layers have a predetermined relation to respective first and second register marks, said first register mark including a first plurality of dots and said second register mark including a second plurality of dots, wherein the frequency of dots in each register mark is minimum at the center and increases with distance in substantially opposite directions from the center of each said register mark, said method comprising:

providing said first register mark including a first plurality of dots at a first frequency arranged in a two dimensional array wherein the frequency of dots in said first register mark is minimum at the center and increases with radial distance in substantially all directions from the center of said first register mark; and providing said second register mark including a second plurality of dots at a second frequency arranged in two dimensional array wherein the frequency of dots in said second register mark is minimum at the center and increases with radial distance in substantially all directions from the center of said second register mark, said frequency of dots in said second register mark being greater than said frequency of said dots in said first register mark at corresponding points of said first and second register marks respectively;

positioning at least one of said first and second layers so that said second register mark is disposed in overlaid relation to said first register mark, thereby producing a bright spot providing a peak indication having a maximum point substantially common to said first and second overlaid register marks indicative of the registration of said first and second register marks;

detecting the position of said bright spot providing a peak indication as said maximum point derived from a set of data points; and providing an indication representative of the position of said bright spot providing a peak indication relative to the center of said one of said first and second register marks.

13. An apparatus for aligning first and second objects, wherein said first and second objects are coupled to respective first and second register marks, said first register mark including a first plurality of dots at a first frequency and said second register mark including a second plurality of dots at a second frequency, said apparatus comprising:

said first register mark including said first plurality of dots wherein the frequency of dots in said first register mark is maximum at the center and decreases with distance in substantially opposite directions from the center of said first register mark; and said second register mark including said second plurality of dots wherein the frequency of dots in said second register mark is maximum at the center and decreases with distance in substantially opposite directions from the center of said second register mark, said frequency of dots in said second register mark being greater than said frequency of said dots in said first register mark at corresponding points of said first and second register marks respectively;

means for positioning at least one of said first and second objects so that said second register mark is disposed in overlaid relation to said first register mark, thereby producing a bright spot providing a peak indication having a maximum point substantially common to said first and second overlaid register marks indicative of the registration of said first and second register marks;

means for detecting the position of said bright spot providing a peak indication as said maximum point derived from a set of data points; and means for moving said one of said first and second objects to reposition said bright spot providing a peak indication towards the center of said one of said first and second register marks.

14. An apparatus in accordance with claim 13, wherein said first register mark is printed, and second register mark is printed over said first register mark.

15. An apparatus in accordance with claim 13, wherein said first register mark is printed, and second register mark is projected over said first register mark.

16. An apparatus in accordance with claim 13, wherein said first object represents a first color plane of a printed color image and said second object represents a second color plane of said printed color image.

17. An apparatus in accordance with claim 13, wherein said first object is a first semiconductor mask of an integrated circuit, and said second object is a second semiconductor mask of said integrated circuit.

18. An apparatus for monitoring the alignment of first and second layers, wherein said first and second layers have a predetermined relation to respective first and second register marks, said first register mark including a first plurality of dots at a first frequency and said second register mark including a second plurality of dots at a second frequency, said apparatus comprising:

said first register mark including a first plurality of dots at a first frequency arranged in a two dimensional array wherein the frequency of dots in said first register mark is maximum at the center and decreases with radial distance in substantially all directions from the center of said first register mark; and said second register mark including a second plurality of dots at a second frequency arranged in two dimensional array wherein the frequency of dots in said second register mark is maximum at the center and decreases with radial distance in substantially all directions from the center of said second register mark, said frequency of dots in said second register mark greater than said frequency of said dots in said first register mark at corresponding points of said first and second register marks respectively;

means for positioning at least one of said first and second layers so that said second register mark is disposed in overlaid relation to said first register mark, thereby producing a bright spot providing a peak indication having a maximum point substantially common to said first and second overlaid register marks indicative of the registration of said first and second register marks;

means for detecting the position of said bright spot providing a peak indication as said maximum point derived from a set of data points; and means for providing an indication representative of the position of said bright spot providing a peak indication relative to the center of said one of said first and second register marks.

19. An apparatus in accordance with claim 18, wherein said first register mark is printed, and second register mark is printed over said first register mark.

20. An apparatus in accordance with claim 18, wherein said first layer represents a first color plane of a printed color image and said second layer represents a second color plane of said printed color image.

21. An apparatus in accordance with claim 18, wherein said first layer is a first semiconductor mask of an integrated circuit, and said second layer is a second semiconductor mask of said integrated circuit.

22. An apparatus in accordance with claim 18, wherein said means for detecting the position of said bright spot indicative of the registration of said first and second register marks includes means for sensing one line of said first and second register marks; and means for moving said first and second register marks thereby forming a two dimensional image of said first and second register marks.

23. An apparatus in for monitoring the alignment of first and second layers, wherein said first and second layers have a predetermined relation to respective first and second register marks, said first register mark including a first plurality of dots and said second register mark including a second plurality of dots, wherein the frequency of dots in each register mark is minimum at the center and increases with distance in substantially opposite directions from the center of each said register mark, said apparatus comprising:

said first register mark including a first plurality of dots at a first frequency arranged in a two dimensional array wherein the frequency of dots in said first register mark is minimum at the center and increases with radial distance in substantially all directions from the center of said first register mark; and said second register mark including a second plurality of dots at a second frequency arranged in two dimensional array wherein the frequency of dots in said second register mark is minimum at the center and increases with radial distance in substantially all directions from the center of said second register mark, said frequency of dots in said second register mark being greater than said frequency of said dots in said first register mark at corresponding points of said first and second register marks respectively;

means for positioning at least one of said first and second layers so that said second register mark is disposed in overlaid relation to said first register mark, thereby producing a bright spot providing a peak indication having a maximum point substantially common to said first and second overlaid register marks indicative of the registration of said first and second register marks;

means for detecting the position of said bright spot providing a peak indication as said maximum point derived from a set of data points; and means for providing an indication representative of the position of said bright spot providing a peak indication relative to the center of said one of said first and second register marks.

24. A method for aligning first and second objects, wherein said first and second objects are coupled to respective first and second register marks, said first register mark including a first plurality of dots at a first frequency and said second register mark including a second plurality of dots at a second frequency, said method comprising:

providing said first register mark including said first plurality of dots wherein the frequency of dots in said first register mark is maximum at the center and decreases with distance in substantially opposite directions from the center of said first register mark; and providing said second register mark including a second plurality of dots wherein the frequency of dots in said second register mark is maximum at the center and decreases with distance in substantially opposite directions from the center of said second register mark, said frequency of dots in said second register mark being greater than said frequency of said dots in said first register mark at corresponding points of said first and second register marks respectively;

positioning at least one of said first and second objects so that said second register mark is disposed in overlaid relation to said first register mark, thereby producing a bright spot providing a peak indication having a maximum point substantially common to said first and second overlaid register marks indicative of the registration of said first and second register marks;

detecting the position of said bright spot providing a peak indication as said maximum point derived from a set of data points; and moving said one of said first and second objects to reposition said bright spot providing a peak indication towards the center of said one of said first and second register marks.

25. A method in accordance with claim 24, wherein said first register mark is printed, and second register mark is printed over said first register mark.

26. A method in accordance with claim 24, wherein said first register mark is printed, and second register mark is projected over said first register mark.

27. A method in accordance with claim 24, wherein said first object represents a first color plane of a printed color image and said second object represents a second color plane of said printed color image.

28. A method in accordance with claim 24, wherein said first object is a first semiconductor mask of an integrated circuit, and said second object is a second semiconductor mask of said integrated circuit.

29. A method for aligning first and second objects, wherein said first and second objects are coupled to respective first and second register marks, said first register mark including a first plurality of dots and said second register mark including a second plurality of dots, said method comprising:

providing said first register mark including a first plurality of dots wherein the frequency of dots in said first register mark is minimum at the center and increases with distance in substantially opposite directions from the center of said first register mark; and providing said second register mark including a second plurality of dots wherein the frequency of dots in said second register mark is minimum at the center and increases with distance in substantially opposite directions from the center of said second register mark, said frequency of dots in said second register mark being greater than said frequency of said dots in said first register mark at corresponding points of said first and second register marks respectively;

positioning at least one of said first and second objects so that said second register mark is disposed in overlaid relation to said first register mark, thereby producing a bright spot providing a peak indication having a maximum point substantially common to said first and second overlaid register marks indicative of the registration of said first and second register marks;

detecting the position of said bright spot providing a peak indication as said maximum point derived from a set of data points; and moving said one of said first and second objects to reposition said bright spot providing a peak indication towards the center of said one of said first and second register marks.

30. A method for monitoring the alignment of first and second layers, wherein said first and second layers have a predetermined relation to respective first and second register marks, said first register mark including a first plurality of dots at a first frequency and said second register mark including a second plurality of dots at a second frequency, said method comprising:

providing said first register mark including a first plurality of dots wherein the frequency of dots in said first register mark is maximum at the center and decreases with distance in substantially opposite directions from the center of said first register mark; and providing said second register mark including a second plurality of dots wherein the frequency of dots in said second register mark is maximum at the center and decreases with distance in substantially opposite directions from the center of said second register mark, said frequency of dots in said second register mark being greater than said frequency of said dots in said first register mark at corresponding points of said first and second register marks respectively;

positioning at least one of said first and second layers so that said second register mark is disposed in overlaid relation to said first register mark, thereby producing a bright spot providing a peak indication having a maximum point substantially common to said first and second overlaid register marks indicative of the registration of said first and second register marks;

detecting the position of said bright spot providing a peak indication as said maximum point derived from a set of data points; and providing an indication representative of the position of said bright spot providing a peak indication relative to the center of said one of said first and second register marks.

31. A method in accordance with claim 30, wherein said first register mark is printed, and second register mark is printed over said first register mark.

32. A method in accordance with claim 30, wherein said first layer represents a first color plane of a printed color image and said second layer represents a second color plane of said printed color image.

33. A method in accordance with claim 30, wherein said first layer is a first semiconductor mask of an integrated circuit, and said second layer is a second semiconductor mask of said integrated circuit.

34. A method in accordance with claim 30, wherein said step of detecting the position of said bright spot indicative of the registration of said first and second register marks includes sensing one line of said first and second register marks; and moving said first and second register marks thereby forming a two dimensional image of said first and second register marks.

35. A method for monitoring the alignment of first and second layers, wherein said first and second layers have a predetermined relation to respective first and second register marks, said first register mark including a first plurality of dots and said second register mark including a second plurality of dots, said method comprising:

providing said first register mark including a first plurality of dots wherein the frequency of dots in said first register mark is minimum at the center and increases with distance in substantially opposite directions from the center of said first register mark; and providing said second register mark including a second plurality of dots wherein the frequency of dots in said second register mark is minimum at the center and increases with distance in substantially opposite directions from the center of said second register mark;

positioning at least one of said first and second layers so that said second register mark is disposed in overlaid relation to said first register mark, thereby producing a bright spot providing a peak indication having a maximum point substantially common to said first and second overlaid register marks indicative of the registration of said first and second register marks, said frequency of dots in said second register mark being greater than said frequency of said dots in said first register mark at corresponding points of said first and second register marks respectively;

detecting the position of said bright spot providing a peak indication as said maximum point derived from a set of data points; and providing an indication representative of the position of said bright spot providing a peak indication relative to the center of said one of said first and second register marks.

36. An apparatus for aligning first and second objects, wherein said first and second objects are coupled to respective first and second register marks, said first register mark including a first plurality of dots at a first frequency and said second register mark including a second plurality of dots at a second frequency, said apparatus comprising:

said first register mark including said first plurality of dots wherein the frequency of dots in said first register mark is maximum at the center and decreases with distance in substantially opposite directions from the center of said first register mark; and said second register mark including said second plurality of dots wherein the frequency of dots in said second register mark is maximum at the center and decreases with distance in substantially opposite directions from the center of said second register mark, said frequency of dots in said second register mark being greater than said frequency of said dots in said first register mark at corresponding points of said first and second register marks respectively;

means for positioning at least one of said first and second objects so that said second register mark is disposed in overlaid relation to said first register mark, thereby producing a bright spot providing a peak indication having a maximum point substantially common to said first and second overlaid register marks indicative of the registration of said first and second register marks;

means for detecting the position of said bright spot providing a peak indication as said maximum point derived from a set of data points; and means for moving said one of said first and second objects to reposition said bright spot providing a peak indication towards the center of said one of said first and second register marks.

37. An apparatus in accordance with claim 36, wherein said first register mark is printed, and second register mark is printed over said first register mark.

38. An apparatus in accordance with claim 36, wherein said first register mark is printed, and second register mark is projected over said first register mark.

39. An apparatus in accordance with claim 36, wherein said first object represents a first color plane of a printed color image and said second object represents a second color plane of said printed color image.

40. An apparatus in accordance with claim 36, wherein said first object is a first semiconductor mask of an integrated circuit, and said second object is a second semiconductor mask of said integrated circuit.

41. An apparatus for aligning first and second objects, wherein said first and second objects are coupled to respective first and second register marks, said first register mark including a first plurality of dots and said second register mark including a second plurality of dots, said apparatus comprising:

a first register mark including a first plurality of dots wherein the frequency of dots in said first register mark is minimum at the center and increases with distance in substantially opposite directions from the center of said first register mark; and a second register mark including a second plurality of dots wherein the frequency of dots in said second register mark is minimum at the center and increases with distance in substantially opposite directions from the center of said second register mark, said frequency of dots in said second register mark being greater than said frequency of said dots in said first register mark at corresponding points of said first and second register marks respectively;

means for positioning at least one of said first and second objects so that said second register mark is disposed in overlaid relation to said first register mark, thereby producing a bright spot providing a peak indication having a maximum point substantially common to said first and second overlaid register marks indicative of the registration of said first and second register marks;

means for detecting the position of said bright spot providing a peak indication as said maximum point derived from a set of data points; and means for moving said one of said first and second objects to reposition said bright spot providing a peak indication towards the center of said one of said first and second register marks.

42. An apparatus for monitoring the alignment of first and second layers, wherein said first and second layers have a predetermined relation to respective first and second register marks, said first register mark including a first plurality of dots at a first frequency and said second register mark including a second plurality of dots at a second frequency, said apparatus comprising:

said first register mark including a first plurality of dots wherein the frequency of dots in said first register mark is maximum at the center and decreases with distance in substantially opposite directions from the center of said first register mark; and said second register mark including a second plurality of dots wherein the frequency of dots in second register mark is maximum at the center and decreases with distance in substantially opposite directions from the center of said second register mark, said frequency of dots in said second register mark being greater than said frequency of said dots in said first register mark at corresponding points of said first and second register marks respectively;

means for positioning at least one of said first and second layers so that said second register mark is disposed in overlaid relation to said first register mark, thereby producing a bright spot providing a peak indication having a maximum point substantially common to said first and second overlaid register marks indicative of the registration of said first and second register marks;

means for detecting the position of said bright spot providing a peak indication as said maximum point derived from a set of data points; and means for providing an indication representative of the position of said bright spot providing a peak indication relative to the center of said one of said first and second register marks.

43. An apparatus in accordance with claim 42, wherein said first register mark is printed, and second register mark is printed over said first register mark.

44. An apparatus in accordance with claim 42, wherein said first layer represents a first color plane of a printed color image and said second layer represents a second color plane of said printed color image.

45. An apparatus in accordance with claim 42, wherein said first layer is a first semiconductor mask of an integrated circuit, and said second layer is a second semiconductor mask of said integrated circuit.

46. An apparatus in accordance with claim 42, wherein said means for detecting the position of said bright spot indicative of the registration of said first and second register marks includes means for sensing one line of said first and second register marks; and means for moving said first and second register marks thereby forming a two dimensional image of said first and second register marks.

47. An apparatus in for monitoring the alignment of first and second layers, wherein said first and second layers have a predetermined relation to respective first and second register marks, said first register mark including a first plurality of dots and said second register mark including a second plurality of dots, said apparatus comprising:

said first register mark including a first plurality of dots wherein the frequency of dots in said first register mark is minimum at the center and increases with distance in substantially opposite directions from the center of said first register mark; and said second register mark including a second plurality of dots wherein the frequency of dots in said second register mark is minimum at the center and increases with distance in substantially opposite directions from the center of said second register mark, said frequency of dots in said second register mark being greater than said frequency of said dots in said first register mark at corresponding points of said first and second register marks respectively;

means for positioning at least one of said first and second layers so that said second register mark is disposed in overlaid relation to said first register mark, thereby producing a bright spot providing a peak indication having a maximum point substantially common to said first and second overlaid register marks indicative of the registration of said first and second register marks;

means for detecting the position of said bright spot providing a peak indication as said maximum point derived from a set of data points; and means for providing an indication representative of the position of said bright spot providing a peak indication relative to the center of said one of said first and second register marks.

48. An apparatus for aligning first and second objects, wherein said first and second objects are coupled to respective first and second register marks, said first register mark including a first plurality of dots and said second register mark including a second plurality of dots, wherein the frequency of dots in each register mark is minimum at the center and increases with distance in substantially opposite directions from the center of each said register mark, said apparatus comprising:

said first register mark including a first plurality of dots at a first frequency arranged in a two dimensional array wherein the frequency of dots in said first register mark is minimum at the center and increases with radial distance in substantially all directions from the center of said first register mark; and said second register mark including a second plurality of dots at a second frequency arranged in two dimensional array wherein the frequency of dots in said second register mark is minimum at the center and increases with radial distance in substantially all directions from the center of said second register mark, said frequency of dots in said second register mark being greater than said frequency of said dots in said first register mark at corresponding points of said first and second register marks respectively;

means for positioning at least one of said first and second objects so that said second register mark is disposed in overlaid relation to said first register mark, thereby producing a bright spot providing a peak indication having a maximum point substantially common to said first and second overlaid register marks indicative of the registration of said first and second register marks;

means for detecting the position of said bright spot providing a peak indication as said maximum point derived from a set of data points; and means for moving said one of said first and second objects to reposition said bright spot providing a peak indication towards the center of said one of said first and second register marks.

* * * * *